US009070536B2

(12) United States Patent
Willwerth et al.

(10) Patent No.: US 9,070,536 B2
(45) Date of Patent: Jun. 30, 2015

(54) PLASMA REACTOR ELECTROSTATIC CHUCK WITH COOLED PROCESS RING AND HEATED WORKPIECE SUPPORT SURFACE

(71) Applicant: APPLIED MATERIALS, INC., Santa Clara, CA (US)

(72) Inventors: Michael D. Willwerth, Campbell, CA (US); David Palagashvili, Mountain View, CA (US); Michael G. Chafin, Santa Clara, CA (US); Ying-Sheng Lin, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 383 days.

(21) Appl. No.: 13/632,306

(22) Filed: Oct. 1, 2012

(65) Prior Publication Data
US 2013/0277339 A1    Oct. 24, 2013

Related U.S. Application Data

(60) Provisional application No. 61/637,448, filed on Apr. 24, 2012.

(51) Int. Cl.
*B23K 9/02* (2006.01)
*H01J 37/32* (2006.01)

(52) U.S. Cl.
CPC ......... *H01J 37/321* (2013.01); *H01J 37/32642* (2013.01); *H01J 37/32724* (2013.01); *H01J 37/32715* (2013.01)

(58) Field of Classification Search
CPC ............. H01J 37/321; H01J 37/32642; H01J 37/32715; H01J 37/32724
USPC ............... 219/121.36, 121.4, 121.41, 121.43, 219/121.44; 216/67–71; 422/186.04; 361/230–235
See application file for complete search history.

(56) References Cited

U.S. PATENT DOCUMENTS

| 4,465,552 | A  | * | 8/1984  | Bobbio et al. ............... 438/722 |
| 6,219,219 | B1 | * | 4/2001  | Hausmann et al. ........... 361/234 |
| 6,353,210 | B1 | * | 3/2002  | Norrbakhsh et al. ......... 219/497 |
| 2004/0025791 | A1 | * | 2/2004 | Chen et al. ................... 118/728 |
| 2004/0027781 | A1 | * | 2/2004 | Hanawa et al. ............... 361/234 |
| 2007/0081294 | A1 | * | 4/2007 | Buchberger et al. ......... 361/234 |
| 2007/0097580 | A1 | * | 5/2007 | Brillhart et al. ............... 361/103 |
| 2007/0258186 | A1 | * | 11/2007 | Matyushkin et al. ........ 361/234 |
| 2009/0274590 | A1 | * | 11/2009 | Willwerth et al. ....... 422/186.04 |
| 2010/0018648 | A1 | * | 1/2010 | Collins et al. ............ 156/345.24 |
| 2010/0039747 | A1 | * | 2/2010 | Sansoni et al. ................ 361/234 |
| 2012/0039747 | A1 |   | 2/2012 | Morfill et al. |

* cited by examiner

*Primary Examiner* — Dana Ross
*Assistant Examiner* — Joseph Iskra
(74) *Attorney, Agent, or Firm* — Robert M Wallace

(57) ABSTRACT

Undesirable heating of a semiconductor process ring is prevented by thermally isolating the process ring from the insulating puck of an electrostatic chuck, and providing a thermally conductive and electrically insulating thermal ring contacting both the semiconductor process ring and an underlying metal base having internal coolant flow passages.

18 Claims, 3 Drawing Sheets

PLASMA REACTOR ELECTROSTATIC CHUCK WITH COOLED PROCESS RING AND HEATED WORKPIECE SUPPORT SURFACE

CROSS-REFERENCE TO RELATED APPLICATIONS

This application claims the benefit of U.S. Provisional Application Ser. No. 61/637,448, filed Apr. 24, 2012 entitled PLASMA REACTOR ELECTROSTATIC CHUCK WITH COOLED PROCESS RING AND HEATED WORKPIECE SUPPORT SURFACE, by Michael D. Willwerth, et al.

BACKGROUND

The disclosure concerns a reactive ion etch process and reactor chamber for etching a thin film such as a dielectric film on a workpiece such as semiconductive wafer. Such processes can employ an etch process gas such as a fluorocarbon or fluoro-hydrocarbon gas whose plasma byproducts include etch species and polymer species. An plasma enhanced reactive ion etch process employing such a gas produces both etching of the thin film and deposition of polymer. We have discovered that uniformity of etch rate distribution and polymer deposition rate distribution near the edge of the workpiece is affected by the temperature of a process ring that surrounds the edge of the workpiece. Initially, immediately prior to plasma processing, the process ring is at the same temperature as a cathode on which the workpiece is held. A metal base layer underlying the cathode includes coolant flow passages for cooling the cathode. During plasma processing, the process ring temperature increases, so that successive workpieces are subject to different process conditions affecting etch rate distribution across the workpiece surface. In processing successive workpieces after igniting a plasma, the distribution of etch rate across the workpiece surface of the first workpiece will differ from that of subsequent workpieces, giving rise to non-uniformities between workpieces.

The process ring temperature increases above the temperature of the workpiece, affecting etch rate near the workpiece periphery. In addition, the higher temperature of the process ring and relatively lower temperature of the workpiece affects polymer deposition near the workpiece periphery. Such changes adversely affect uniformity of distribution of etch rate polymer deposition rate near the workpiece periphery.

SUMMARY

A method of performing plasma-enhanced etching on a workpiece such as a semiconductor wafer using a polymerizing etch species. The method provides control of polymer deposition rate and etch rate near the periphery of the workpiece. The method is carried out in the chamber of a plasma reactor that includes an insulating puck forming a workpiece support surface and a metal base layer contacting the insulating puck. The method includes providing a semiconductive process ring overlying a peripheral portion of the insulating puck, and maintaining a gap between the process ring and the insulating puck, so as to prevent direct thermal contact between the process ring and the insulating puck. The method further includes providing a thermal ring between and in contact with the base layer and the semiconductive process ring, the thermal ring being a thermal conductor and an electrical insulator. The method also includes holding the workpiece on the workpiece support surface of the insulating puck, introducing a process gas into the chamber and coupling plasma source power into the interior of the chamber. The method also includes cooling the process ring below a first temperature by flowing coolant through coolant flow passages in the base layer, and heating the workpiece above a second temperature by applying electric power to a heating element inside the insulating puck.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

FIGS. 1A, 1B and 1C depict a plasma reactor in accordance with one embodiment, of which:

FIG. 1A is a cross-sectional elevational view depicting the entire chamber of the plasma reactor;

FIG. 1B is an enlarged view of a portion of FIG. 1A depicting the workpiece support pedestal.

FIG. 1C is an enlarged view of a portion of FIG. 1B showing in detail a process ring and thermal ring.

Figure 1A:
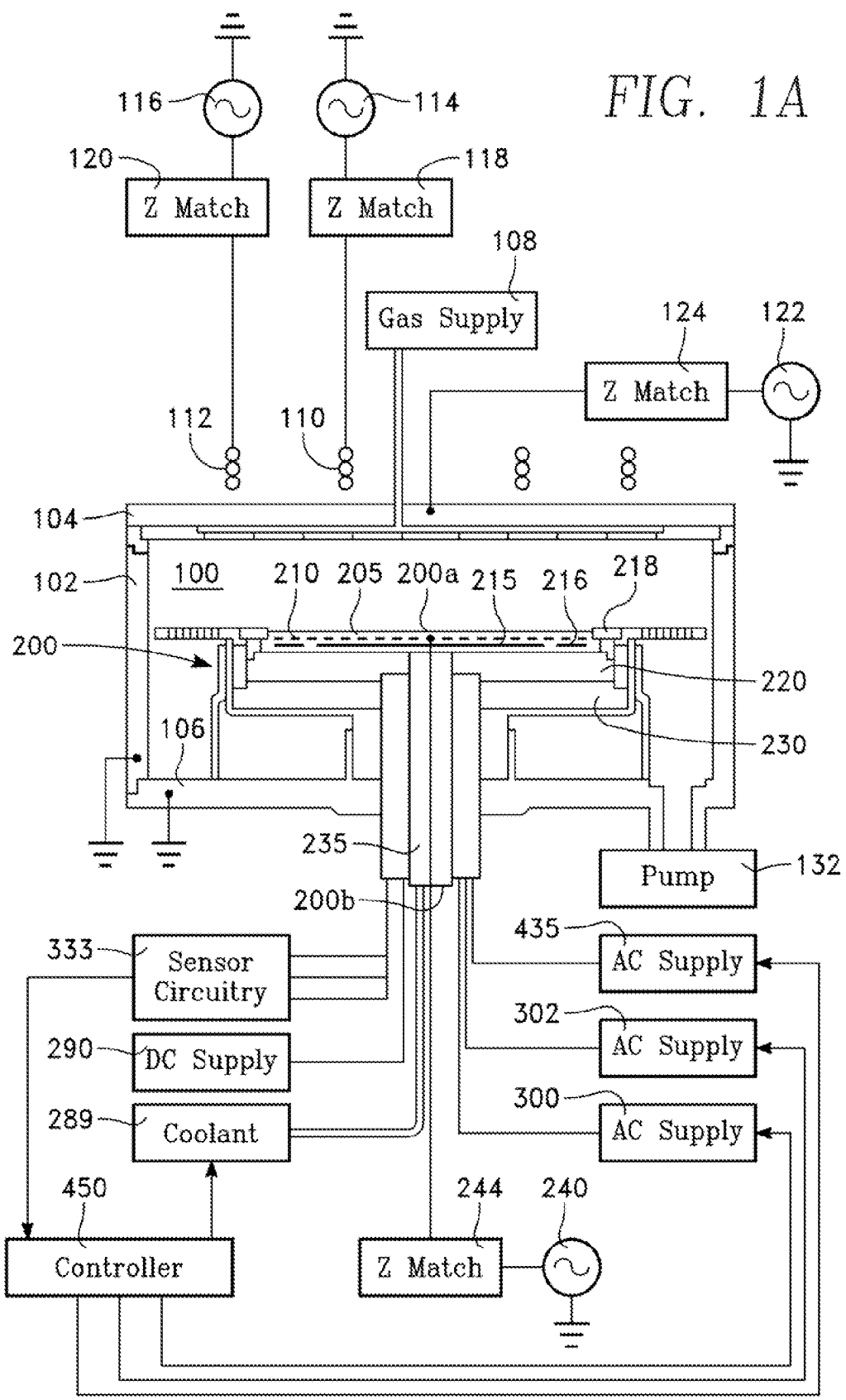

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Figure 1B:
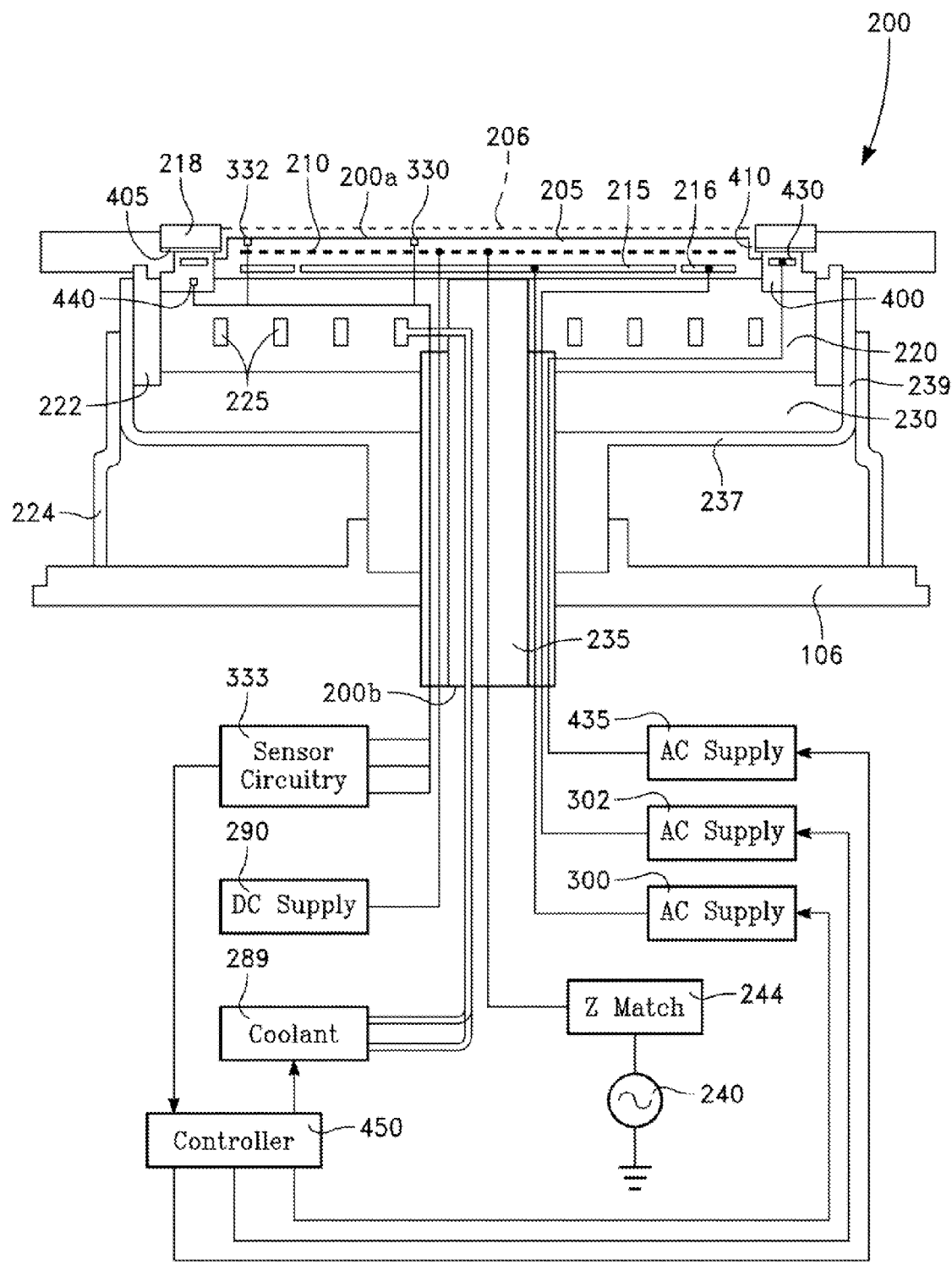
Figure 1C:
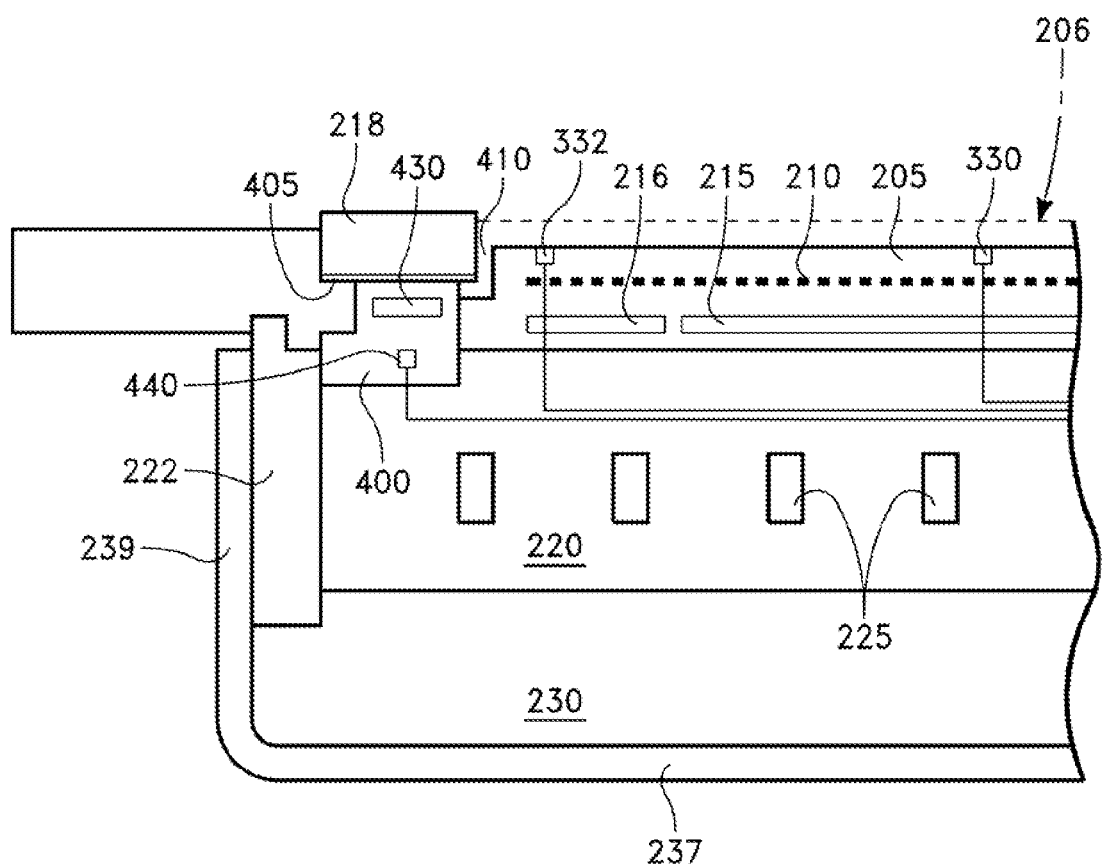

Referring to FIGS. 1A, 1B and 1C, a plasma reactor has a chamber 100 defined by a cylindrical sidewall 102, a ceiling 104 and a floor 106 whose peripheral edge meets the sidewall 102. The ceiling 104 may be a gas distribution plate that receives process gas from a process gas supply 108. Plasma source power may be inductively coupled or capacitively coupled into the chamber 100.

For example, in the case of inductive coupling of plasma source power, respective inner and outer coil antennas 110, 112 are connected to respective RF source power generators 114, 116 through respective RF impedance match elements 118, 120. In this case, the ceiling or gas distribution plate 104 may be formed of a non-conductive material in order to permit inductive coupling of RF power from the coil antennas 110, 112 through the ceiling 104 and into the chamber 100.

In the case of capacitive coupling of RF source power, the coil antennas 110 and 112 are not present, and the ceiling 104 is a conductive electrode. An RF generator 122 is coupled through an impedance match 124 to the ceiling 104. Generally, the sidewall 102 and the floor 106 may be formed of metal and connected to ground. A vacuum pump 132 evacuates the chamber 100 through the floor 106.

A workpiece support pedestal 200 is provided inside the chamber 100 and has a top workpiece support surface 200a and a bottom end 200b below the floor 106, and an axial stem 235 extending upwardly from the bottom end 200b and through the floor 106.

The pedestal 200 includes a disk-shaped insulating puck or top layer 205 forming the top workpiece support surface 200a. The puck 205 contains an internal electrostatic chucking (ESC) electrode 210 close to the top surface 200a. The puck 205 also contains inner and outer electrically resistive heating elements 215, 216. Underlying the puck 205 is a disk-shaped metal base 220, which may be formed of aluminum. The workpiece support surface 200a is the top surface of the puck 205 for supporting a workpiece 206 such as a semiconductive wafer. Internal coolant passages 225 are provided in the metal base 220. A disk-shaped insulator or planar insulator layer 230 underlies the metal base 220, and may be formed of a silicon dioxide or silicon nitride material, for example. A conductive support dish 237 underlies the insulator 230 and may support a cylindrical wall 239 surrounding the insulator 230, the base 220 and the puck 205.

An RF bias power generator 240 is coupled through and impedance match 244 to the ESC electrode 210. Alternatively, the RF bias generator may be coupled to the metal base 220.

A process ring 218 overlies the edge of the puck 205. The process ring 218 may be formed of a semiconductor material such as crystalline silicon. An insulation ring 222 provides electrical insulation between the base 220 and the pedestal side wall 239. A skirt 224 extends from the floor and surrounds the pedestal side wall 239.

A coolant supply 289 is coupled to the internal coolant passages 225. A D.C. workpiece clamping voltage source 290 is coupled to the ESC electrode 210. The inner and outer heater elements 215 and 216 are connected to respective AC power supplies 300 and 302.

In one embodiment, an inner zone temperature sensor 330 extends through an opening in the workpiece support surface 200a and an outer zone temperature sensor 332 extends through another opening in the workpiece support surface 200a. Electrical (or optical) connection from the temperature sensors 330, 332 to sensor circuitry 333 is provided through the pedestal.

PROBLEM TO BE SOLVED

The process ring 218 overlies and is in direct thermal contact with the puck 205 so as to be heated by the heater element 216. However, the process ring 218 is separated from the metal base 220 by the puck 205. This separation beneficially provides electrical separation between the semiconductive process ring 218 and the metal base 220. The problem is that such separation prevents direct thermal conductance between the process ring 218 and the cooled metal base 220, so that all cooling of the process ring 218 is through an indirect thermal path through the puck 205. Thus, the metal base 220 cools the puck 205 directly while cooling the process ring 218 indirectly. As a result, the workpiece 206 is cooled more rapidly than the process ring 218. During plasma processing, the process ring temperature increases above the temperature of the workpiece 206, affecting etch rate near the workpiece periphery. In addition, the higher temperature of the process ring 218 and relatively lower temperature of the workpiece 206 affects polymer deposition near the workpiece periphery. Such changes adversely affect the etch rate and the polymer deposition rate near the workpiece periphery. For example, the higher temperature of the process ring 218 and lower temperature of the workpiece 206 favor a higher polymer deposition rate on the workpiece than the process ring 218.

SOLUTION TO THE PROBLEM

A thermally conductive ring 400 is disposed between the process ring 218 and the metal base 220, to enhance cooling of the process ring 218. In addition, heating of the process ring 218 by the heater element 216 is prevented by providing an air gap 410 between the process ring 218 and the puck 205.

The material of the thermally conductive ring 400 has a very high thermal conductance, sufficient to approximate direct thermal contact between the process ring 218 and the metal base 220. However, the material of the thermally conductive ring 400 is an electrically insulating material that approximates a perfect insulator. One example of a suitable material for the thermally conductive ring is aluminum nitride. In one example, the thermally conductive ring 400 has a thermal conductance of 120 Watts/m-° K and an electrical volume resistivity of about $10^{14}$ Ω-m or greater. The thermal ring conductance may lie in a range of 100-380 Watts/m-° K, while the thermal ring electrical resistivity may be above $10^{13}$ Ω-m.

In one embodiment, a layer of double sided thermally conductive tape 405 may be disposed between the process ring 218 and the thermally conductive ring 400. The thermally conductive tape has a thermal conductance similar to that of the thermally conductive ring 400, and may have a thickness of a few millimeters. In some cases, it may be formed of a aluminum nitride foil or a similar material with adhesive film on both surfaces. Such double sided thermally conductive tape is available from Shin-Etsu MicroSi, Inc. The purpose of the thermally conductive tape is to enhance the thermal conductance through the interface between the process ring 218 and the thermally conductive ring 400.

The introduction of the thermally conductive ring 400 contacting both the process ring 218 and the metal base 220, and imposition of the air gap 410 between the process ring 218 and the puck 205, enables the temperatures of the process ring 218 and of the workpiece 206 to be controlled differently. Specifically, the one may be maintained at a different temperature from the other. Advantageously, the process ring 218 is maintained at a temperature higher than that of the workpiece 206. In a working example, the process ring 218 was maintained at a temperature in a range of 5° C.-15° C. higher than the temperature of the workpiece 206.

In a modified embodiment, the temperature of the process ring 218 is controlled independently from the temperature of the wafer 206, by providing a separately controlled heater element 430 within the thermally conductive ring 400. The heater element 430 may receive electrical power from a heater power supply 435 through insulated conductors extending through the metal base 220. In addition, a temperature sensor 440 may be coupled to or provided inside of the thermally conductive ring and coupled to the sensor circuitry 333 through the metal base 220. A controller 450 senses the workpiece temperature and the process ring temperature through the sensor circuitry 333. The controller 450 governs the flow rate and/or temperature of the coolant supply 289, and the levels of electric power output by the heater power supplies 300, 302 and 435, separately, so as to maintain the workpiece at a target workpiece temperature while maintaining the process ring at a target process ring temperature. The workpiece and process ring target temperatures are independently selected by programming the controller 450.

The reactor is operated in accordance with the following method: the process ring 218 is cooled by the coolant in the metal base 220 (through the thermally conductive ring 400) to a desired process ring temperature. At the same time, while the workpiece 206 is heated by the heaters 215 and 216 to a desired workpiece temperature. In one embodiment, the desired workpiece temperature is greater than the desired process ring temperature. For example, the process ring temperature may be in a lower range of 30° C.-80° C., while the workpiece temperature is in a higher range of 90° C.-100° C. By controlling the temperature difference between the workpiece 206 and the process ring 218, the etch rate and the polymer deposition rate near the workpiece periphery is controlled.

While the foregoing is directed to embodiments of the present invention, other and further embodiments of the invention may be devised without departing from the basic scope thereof, and the scope thereof is determined by the claims that follow.

What is claimed is:

1. A method of performing a plasma-enhanced etch process on a workpiece in a chamber of a plasma reactor, said plasma reactor comprising:
   an insulating puck in said chamber and an ESC electrode in said insulating puck;
   a metal base layer beneath and contacting said insulating puck and having a diameter exceeding a diameter of said insulating puck, said metal base layer being coupled to a common potential;
   an RF plasma bias power generator having a power terminal coupled to said ESC electrode and a return terminal coupled to said common potential;
   said method comprising:
      providing a semiconductive process ring overlying a peripheral portion of said insulating puck and a gap between said process ring and said insulating puck preventing direct thermal contact between said process ring and said insulating puck;
      providing a thermal ring between and in contact with said base layer and said semiconductive process ring, said thermal ring being a thermal conductor and an electrical insulator, wherein said thermal ring has a thermal conductivity in excess of about 100 Watts/m-° K;
      holding a workpiece on a surface of said insulating puck, introducing a process gas into said chamber and coupling plasma source power into the interior of said chamber;
      cooling said process ring below a first temperature by flowing coolant through coolant flow passages in said base layer; and
      heating said workpiece above a second temperature by applying electric power to a heating element inside said insulating puck.

2. The method of claim 1 wherein said second temperature exceeds said first temperature.

3. The method of claim 2 wherein said introducing a process gas comprises introducing a process gas whose plasma byproducts comprise etchant species and polymerizing species, whereby said generating a plasma produces said plasma by-products in said chamber.

4. The method of claim 3 wherein said introducing a process gas comprises introducing a process gas containing fluorocarbon species or fluoro-hydrocarbon species.

5. The method of claim 1 wherein said gap is an air gap.

6. The method of claim 1 wherein said thermal ring has a resistivity above $10^{13}$ Ω-m.

7. The method of claim 1 wherein said thermal ring comprises aluminum nitride.

8. The method of claim 1 further comprising periodically sensing the temperature of said semiconductive process ring and the temperature of said workpiece, and comparing said temperatures with respective target temperatures.

9. The method of claim 8 further comprising adjusting flow rate of the coolant through said metal base layer and adjusting the electric power to said heating element in response to said comparing.

10. The method of claim 2 wherein the difference between said first and second temperatures is in a range of 5° C.-15° C.

11. A plasma reactor comprising:
    a chamber, an insulating puck in said chamber and an ESC electrode in said insulating puck;
    a metal base beneath and contacting said insulating puck and having a diameter exceeding a diameter of said insulating puck, said metal base being coupled to a common potential;
    an RF plasma bias power generator having a power terminal coupled to said ESC electrode and a return terminal coupled to said common potential;
    a process ring overlying a peripheral portion of said insulating puck, and a gap separating said process ring from said insulating puck whereby said process ring is thermally isolated from said insulating puck by said gap;
    a thermal ring between and in contact with said metal base and said semiconductive process ring, said thermal ring being a thermal conductor and an electrical insulator, wherein said thermal ring has a thermal conductivity in excess of about 100 Watts/m-° K;
    a plasma source power applicator, and a source of process gas and gas distribution orifices coupled to said source of process gas;
    coolant flow passages in said metal base layer and a coolant source coupled to said coolant flow passages;
    electric heater element in said puck and a source of electrical power coupled to said heater element.

12. The plasma reactor of claim 11 wherein said gap is an air gap.

13. The plasma reactor of claim 11 wherein said process ring comprises a semiconductive material.

14. The plasma reactor of claim 11 wherein said thermal ring has a resistivity above $10^{13}$ Ω-m.

15. The plasma reactor of claim 11 wherein said thermal ring comprises aluminum nitride.

16. The plasma reactor of claim 11 further comprising a layer of thermal tape between said thermal ring and said process ring.

17. The plasma reactor of claim 11 further comprising a layer of thermal tape between said thermal ring and said metal base.

18. The plasma reactor of claim 11 further comprising:
    a temperature sensor coupled to sense a temperature of said process ring;
    a temperature sensor coupled to sense a temperature of said workpiece;
    a controller responsive to said temperature sensors to govern said coolant source and said source of electrical power.

* * * * *